United States Patent [19]

Betz et al.

[11] 4,290,845

[45] Sep. 22, 1981

[54] PROCESS FOR THE PRODUCTION OF HIGH TEMPERATURE-RESISTANT METALLIC COMPONENTS WITH FINELY POROUS WALLS

[75] Inventors: Wolfgang Betz, Munich; Axel Rossmann, Karlsfeld, both of Fed. Rep. of Germany

[73] Assignee: MTU Motoren-und Turbinen Union, Fed. Rep. of Germany

[21] Appl. No.: 131,847

[22] Filed: Mar. 19, 1980

[30] Foreign Application Priority Data

Mar. 24, 1979 [DE] Fed. Rep. of Germany ....... 2911714

[51] Int. Cl.³ .............................................. C23F 1/02
[52] U.S. Cl. ................................... 156/644; 156/656; 156/664
[58] Field of Search ................... 75/20 F, 101 R, 222, 75/227; 29/156.8 H, 156.8 T; 164/122, 131, 132; 156/644, 656, 630, 634, 664

[56] References Cited

U.S. PATENT DOCUMENTS 3,594,292  7/1971  Russell et al. ................. 156/644 X
4,141,781  2/1979  Greskovich et al. ........... 156/644 X

*Primary Examiner*—William A. Powell
*Attorney, Agent, or Firm*—Scully, Scott, Murphy & Presser

[57] ABSTRACT

A process for the production of high temperature-resistant metallic components with finely porous walls through which there can diffuse a cooling medium. The component is formed of an alloy capable of oriented eutectic solidification, and is cooled in a controlled mode after short-term sintering so as to form needles or rods extending perpendicular to the wall surfaces, and which are then etched out so as to provide cooling medium passageways.

8 Claims, 1 Drawing Figure

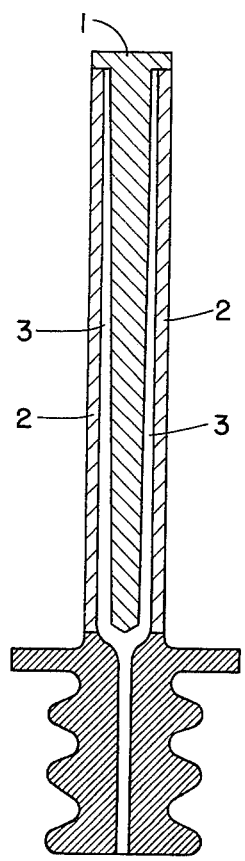

PROCESS FOR THE PRODUCTION OF HIGH TEMPERATURE-RESISTANT METALLIC COMPONENTS WITH FINELY POROUS WALLS

BACKGROUND OF THE INVENTION

1. Field of the Invention

The present invention relates to a process for the production of high temperature-resistant metallic components having finely porous walls, and particularly such through which a cooling medium can diffuse.

For thin-walled high temperature components such as, for example, combustion chambers or the turbine blades of gas turbines which are to be cooled with the end of a through-passing cooling medium pursuant to the effusion principle, it is desirable to provide finely porous, thin metal walls. Effusion cooling is a particularly effective type of cooling which, for instance when applied to combustion chambers, will afford the advantage that the cooling medium will take part in the combustion process whereby it is possible to contemplate advantages through uniform combustion (for example, improved combustion, as a result a lower fissure formation and a lower proportion of $NO_x$ in the exhaust gas).

2. Discussion of the Prior Art

Heretofore, wire meshes and metal feltings have been utilized for effusion-cooled, thin-walled high temperature components which, however, evidence an inadequate high-temperature stability or strength and oxidation resistance in a temperature range of 1000° C. and higher. Moreover, the shaping of such materials is difficult and substantive connections (for instance, through welding or soldering) are only possible to an insufficient extend due to the apparent notching effect and adverse influence on the material matrix. Also in the field of producing turbine blades it has not been possible until the present to be able to fasten high-temperature resistant porous layers as a blade sheathing upon a supporting core.

The most recent investigations have now indicated that it is possible, with the aid of oriented eutectic solidification, to produce extremely finely porous filter membranes with through porosity, in which thin discs are separated from a rod of oriented eutectically solidified material transversely to the fiber orientation, and whereupon the fibers of the one material are then etched out.

SUMMARY OF THE INVENTION

Accordingly, it is an object of the present invention to provide a novel process for the production of high-temperature resistant, thin-walled metallic components having finely porous walls.

A more specific object of the present invention is to provide a process as described hereinabove in which the metallic component is produced by shaping the component from an alloy adapted for oriented eutectic solidification, subjecting the component to short-term sintering and controlled cooling so that the propagation of solidification extends perpendicular to the wall surfaces, and etching out the respective needles or rods from the solidified component.

Through adjustment of the temperature gradients it is possible to precisely determining the orientation of the of the solidified fibers and, as a result, the subsequently to be produced porosity through the etching out of the fibers or needle. It is of a decisive advantage when the sintering and the controlled cooling are effectuated in the absence of gravity and under a high-vacuum, in essence, under outerspace conditions. Avoided hereby can be the influences on the fiber formation caused by gravity, particularly their orientation, so that the fibers produced during the oriented eutectic solidification extend precisely in conformance with the temperature gradient which has been set during the cooling. The controlled cooling can be supported by one-sided heating during the cooling process. The fiber shape and size can be optionally correlated with current requirements through control of the process parameters during the solidification process, for example, the magnitude of the temperature gradient and/or through suitable selection of the alloy which is capable of oriented eutectic solidification.

In order not to risk a change in the configuration of the component during under gravity-less conditions, the process should also be effected in a high-vacuum. The coating of high temperature melting material, such as a ceramic, hereby also serves as a supportive layer to aid in maintaining the shape. Such supportive layers can be applied, for instance, through deposition pursuant to the CVD process (Chemical Vapor Deposition). Even oxide coatings, for example, as disclosed in German Laid-open Patent Application No. 25 50 858, can serve this purpose. This coating may then be removed after the solidification of the core material.

In the utilization of the inventive process for the production of an effusion-cooled turbine blade, the alloy which is capable of the oriented eutectic solidification should be applied on a supportive core of high strength, and either (a) subsequent to the etching procedure of the through-extending porosity of the turbine vane wall, there are mechanically introduced cooling medium passageways beneath this finely porous surface coating or (b) cooling medium passageways are etched out by an etching medium similar to that producing the through extending porosity, which is particularly effective on the core metal. The supply of the surface coating or sheathing (turbine blade wall) with the cooling medium can be facilitated through large elongate passageways within the supportive core.

As material which is capable of oriented eutectic solidification there may be considered alloys of the type designated in the technical literature (refer to "gerichtet erstarrte eutektische Werkstoffe" by W. Kurz and P. R. Sahm, volume 25 from the series "Reine und angewandte Metallkunde", published Koster, Springer Verlag Berlin, Heidelberg) as follows:

Type I: C73
Type II: Cotac
Type III: $\gamma\gamma'\delta Cr_3C_2$ wherein:

Type I $\triangleq$ [(CoCr)$_1$—(CrCo$_7$C$_3$)$_2$]
Type II $\triangleq$ [(NiCrCoA)$_1$—(MC)$_2$], MC=Metal carbide
Type III $\triangleq$ [(NiCrA)$_1$—(Cr$_3$C$_2$)$_2$].

BRIEF DESCRIPTION OF THE DRAWING

Reference may now be had to the following description of a preferred embodiment of the invention, taken in conjunction with the single FIGURE of the accompanying drawing showing a longitudinal section through a turbine blade.

DETAILED DESCRIPTION

Illustrated in the drawing is a turbine blade produced in accordance with the inventive process. In the drawing, the core of the blade, which consists of a material of high strength, is designated with reference numeral 1. Arranged between this blade core 1 and the blade wall 2 which is provided with a through-extending porosity, are cooling medium passageways 3 which unite into a common cooling medium passageway in the region of the base of the blade.

What is claimed is:

1. A process for producing high temperature-resistant metallic components of complex shape having finely porous walls, particularly such facilitating the diffusion therethrough of a cooling medium, comprising the steps of:
   (a) imparting the configuration to said component from an alloy adapted for oriented eutectic solidification;
   (b) effecting a short-term sintering to said component and controlled cooling so that the solidification propagation extends perpendicular to the wall surfaces, including wall surfaces of complex shape;
   (c) and etching out formed needles or rods from the solidified component.

2. A process as claimed in claim 1, comprising effecting said sintering and controlled cooling of said component under gravity-less conditions and in a high-vacuum.

3. A process as claimed in claim 1 or 2, comprising supporting said controlled cooling through one-sided heating during said cooling process.

4. A process as claimed in claim 1, comprising coating said component with a high temperature melting material preceding said sintering step, said material having a melt point substantially higher than that of the component material; and removing said coating after solidification of the material of said component.

5. A process as claimed in claim 1, said component being an effusion-cooled turbine blade, comprising arranging said alloy adapted for oriented eutectic solidification on a supportive core having high strength; and forming cooling medium passageways beneath the finely porous surface coating subsequent to said etching sequences.

6. A process as claimed in claim 5, comprising forming said cooling medium passageways through etching with etching means particularly effective on core metal.

7. A process as claimed in claim 5, comprising forming cooling passageways in said core preceding the application of the coating adapted for oriented eutectic solidification on said supportive core, said passageways being filled with high-temperature melting material, such as ceramic, and removing said material from said passageways with an etching medium after completion of said finely porous surface coating.

8. A process as claimed in claim 1, said alloy solidifying and forming needles and rods through said oriented eutectic solidification which are adapted to be removed through said etching medium, said alloy being of a type selected from the group consisting of Type I $\triangleq$ [(CoCr)$_1$—(CrCo$_7$C$_3$)$_2$]
Type II $\triangleq$ [(NiCrCoA)$_1$—(MC)$_2$] wherein MC=Metal carbide
Type III $\triangleq$ [(NiCrA)$_1$—(Cr$_3$C$_2$)$_2$].

* * * * *